(12) United States Patent
Lesea

(10) Patent No.: US 7,619,486 B1
(45) Date of Patent: Nov. 17, 2009

(54) METHOD FOR DETECTING AND COMPENSATING FOR TEMPERATURE EFFECTS

(75) Inventor: Austin H. Lesea, Los Gatos, CA (US)

(73) Assignee: XILINX, Inc., San Jose, CA (US)

( * ) Notice: Subject to any disclaimer, the term of this patent is extended or adjusted under 35 U.S.C. 154(b) by 212 days.

(21) Appl. No.: 11/715,534

(22) Filed: Mar. 7, 2007

(51) Int. Cl.
*H03L 1/04* (2006.01)
(52) U.S. Cl. .............................. 331/176; 331/2; 331/57; 374/170
(58) Field of Classification Search .................... 331/57, 331/66, 176, 2; 374/170
See application file for complete search history.

(56) References Cited

U.S. PATENT DOCUMENTS

| 6,390,672 | B1 | 5/2002 | Vail et al. |
| 6,614,124 | B1* | 9/2003 | Brown et al. ................ 365/226 |
| 6,737,925 | B1 | 5/2004 | Logue et al. |
| 6,784,048 | B2* | 8/2004 | Leung et al. ................ 438/239 |
| 6,814,485 | B2* | 11/2004 | Gauthier et al. ............. 374/170 |
| 7,088,172 | B1 | 8/2006 | Lesea et al. |
| 7,391,274 | B2* | 6/2008 | Hsu ............................. 331/57 |
| 2007/0218623 | A1* | 9/2007 | Chua et al. .................. 438/240 |

OTHER PUBLICATIONS

U.S. Appl. No. 11/715,510, filed Mar. 7, 2007, Trimberger, Stephen, M., et al., Xilinx, Inc. 2100 Logic Drive, San Jose, CA 95124.

* cited by examiner

*Primary Examiner*—Robert Pascal
*Assistant Examiner*—James E Goodley
(74) *Attorney, Agent, or Firm*—Justin Liu

(57) ABSTRACT

An integrated circuit fabricated in a multiple oxide process can be used to provide a temperature-insensitive circuit. The temperature-insensitive circuit can be a ring oscillator; this ring oscillator can be used as a low-cost integrated reference frequency to monitor and to modify the behavior of the integrated to produce the desired results. In some embodiments, the reference oscillator output can be compared to second oscillator output where the second oscillator performance is temperature-sensitive. The comparison result can be monitored and processed to power down the integrated circuit.

16 Claims, 11 Drawing Sheets

METHOD FOR DETECTING AND COMPENSATING FOR TEMPERATURE EFFECTS

FIELD OF THE INVENTION

The invention relates to detecting temperature variation. More particularly, the invention relates to monitoring and/or processing temperature variation in integrated circuits (ICs).

BACKGROUND OF THE INVENTION

Addressing thermal effects in integrated circuits (ICs) is an ongoing challenge. The performance of an IC varies as temperature changes, and often the resulting variation is undesirable. The end users demand a predictable and reliable IC performance over a prescribed temperature range. Therefore, designers employed passive and active means to achieve the desired results.

Current techniques utilized in addressing temperature variation have limitations. These limitations include, additional design resources, cost penalties, additional silicon, and/or board area allocation, increased power consumption, etc. An example of a passive means to control the IC temperature, and thus IC performance, can be a heat sink with an air forcing mechanism. This method works well at elevated temperatures, but not at low temperatures. Also, the method stated above requires additional elements, power, area, and has increased cost. An alternative, an active method that can include a temperature stable external reference oscillator coupled to a Phase Locked Loop (PLL). The PLL can provide a stable clock output over temperature variation. The PLL clock output can be used as a reference, and coupled with other circuitry can yield a closed loop system that can adjust for temperature variation. Again, this method requires additional elements, power, die area, design resources, and it is very costly.

Therefore, it is desirable to provide circuits and methods that can enable the end user to employ an IC with minimal consideration to performance degradation due to temperature variation and a cost effective means to employ such circuit on an IC.

SUMMARY OF THE INVENTION

The invention provides an IC fabricated in a multi oxide process that may provide a temperature-insensitive circuit. The temperature-insensitive circuit can be a ring oscillator used as a reference frequency. In some embodiments, the temperature-insensitive ring oscillator output can be compared to an output of second oscillator, where the second oscillator performance may be temperature-sensitive. The comparison result can be monitored and/or processed to power down a portion or the entire IC.

In some embodiments, the temperature-insensitive circuit can include a configurable logic block (CLB), and therefore programmable logic devices (PLDs).

Some embodiments also may include a compensation circuit. The compensation circuit can be coupled to output of frequency comparator and input of the temperature-sensitive oscillator. The compensation circuit responds to the output of the frequency comparator and can control operation of the temperature-sensitive oscillator.

In some embodiments, a comparator includes a decision circuit. Output of the decision circuit can be asserted in response to a rapid temperature change. The output of the decision circuit can be used to disable a secure IP block, as a possible indication of a security breach.

In some embodiments, the temperature-insensitive circuit may include a temperature-insensitive delay element. The temperature-insensitive delay element can be coupled to a first input of comparator. A temperature-sensitive delay element can be coupled to a second input of the comparator, where the comparator produces a signal in response to a phase difference.

BRIEF DESCRIPTION OF THE DRAWINGS

The present invention is illustrated by way of example, and not by way of limitation, in the following figures.

The present invention is illustrated by way of example, and not by way of limitation, in the following figures.

DETAILED DESCRIPTION OF THE DRAWINGS

In the following description, numerous specific details are set forth to provide a more through understanding of the present invention. However, it will be apparent to one skilled in the art that the present invention can be practiced without these specific details. In other instances, well-known circuits or devices may be omitted or presented in an abstract form in order to avoid obscuring the present invention.

Figure 1:
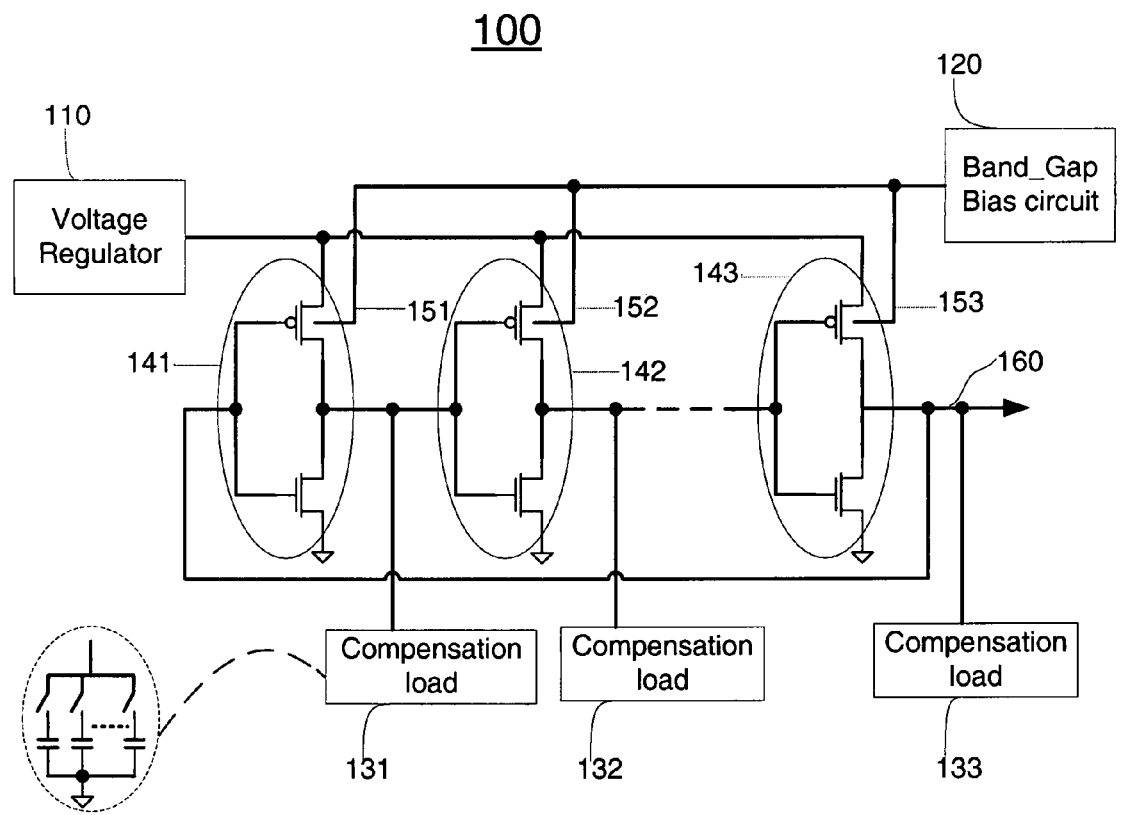
FIG. 1 illustrates a typical ring oscillator with various means of compensation.

FIG. 1 illustrates a typical ring oscillator 100 with various means of compensation. An odd number of inverting gates are required to construct a ring oscillator. Inverting gates 141-143, are shown as inverters consisting of NMOS transistors and PMOS transistors, the PMOS transistors having body nodes 151-153 according to this embodiment. Inverting gates 141-143 are coupled in series and output of inverting gate 143 is coupled to input of inverting gate 141. A voltage regulator 110 is coupled to supply nodes of inverting gates 141-143. Voltage regulator 110 provides a regulated bias to the ring oscillator 100, and it can be adjusted for optimum performance and/or to compensate for process and/or temperature variation.

Circuits 131-133 are compensation loads, and they can be active or passive capacitive loads. As shown in FIG. 1, the compensation loads are passive capacitance loads. The compensation loads 131-133 are coupled to output nodes of inverting gates 141-143. Compensation loads 131-133 can be configured to delay or speed up the ring oscillator operation by adding or removing capacitance, respectively. For example, if capacitances are added, this can slow down the operation of the ring oscillator and thus reduce output frequency of the ring oscillator. Another method of adjusting the ring oscillator performance is to couple a programmable band-gap circuit 120 to a body node of a transistor, where the programmable band-gap circuit can provide voltage bias. The ring oscillator 100 shown in FIG. 1, band-gap voltage bias is applied to the body nodes of PMOS transistors. Threshold voltage (Vt) of the PMOS transistors changes in accordance with applied band-gap voltage bias, thus changing switching characteristics of the PMOS transistor thus affecting the ring oscillator operation.

Ring oscillator 100 can be adjusted to produce the desired output frequency at given conditions. In some instances, at least one compensation circuit is needed to attain the desired result. A person skilled in the art can determine what compensation circuit(s) is needed to meet the performance criteria. Circuits 110, 120, 131-133 may need additional support circuits in order fully utilize these compensation mechanisms.

Figure 2B:
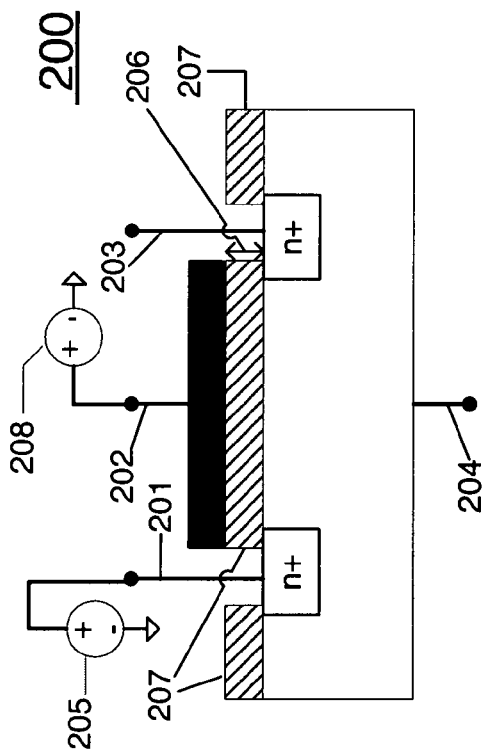
FIG. 2B illustrates a drawing of a temperature-insensitive PMOS transistor having a mid oxide thickness according to an embodiment of the invention.
Figure 2B:
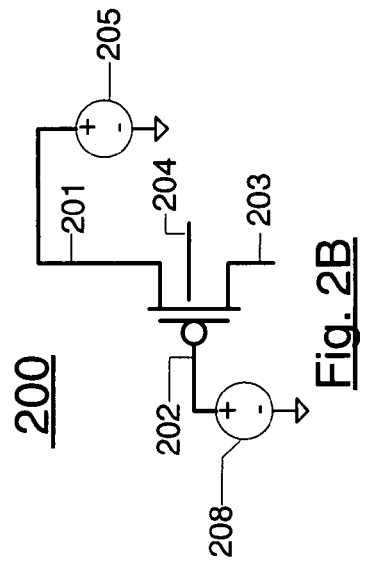
Figure 2A:
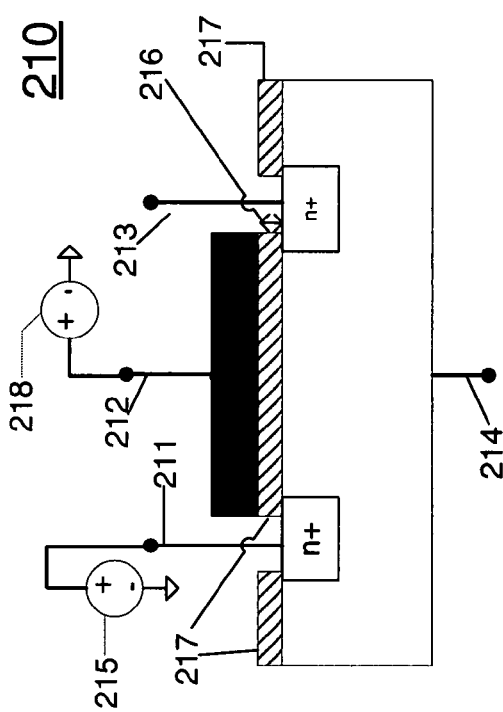
FIG. 2A illustrates a drawing of a typical PMOS transistor having a thin Oxide thickness.
Figure 2A:
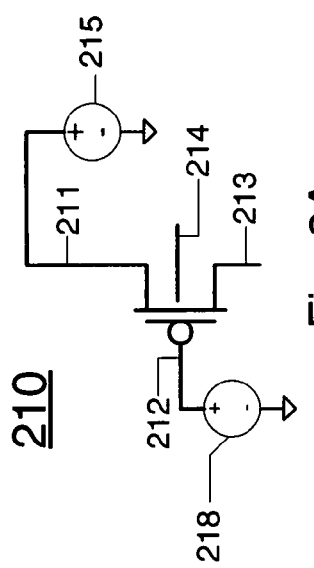

FIG. 2A illustrates a drawing of a typical PMOS transistor fabricated in a 65 nm process, where the typical PMOS transistor has a first oxide or a first oxide thickness, where the first oxide has a thin oxide thickness. The typical PMOS transistor 210 has connection nodes 211, 212, 213, and 214, which correspond to source, gate, drain, and body connections, respectively. Transistor 210 can be fabricated in a 65 nm process, and has a first oxide 217 where the first oxide has a thin oxide thickness 216. For example, in some embodiments, the thin oxide thickness 216 may be in the range of 12.2-13.1 Å (Angstrom). Transistor 210 is also coupled to bias voltages 215 and 218. Voltage bias 215 can be applied to the source or the drain of transistor 210 in accordance to the design specifications, and bias voltage 218 can be coupled to the gate node of transistor 210 and typically has a similar value as bias 215. Speed performance of transistor 210 is sensitive to temperature as shown in curve 260 of graph 220 in FIG. 2C, as will be described in detail below.

In other embodiments, other transistors having temperature sensitivity behavior can be fabricated in a 65 nm process. For example, a temperature-sensitive NMOS transistor can be fabricated in a 65 nm process having a first oxide 217 where the first oxide has a thickness 216, and bias voltages 215 and 218. In some embodiments, other oxide thicknesses and/or bias voltages may be used.

FIG. 2B illustrates a drawing of a temperature-insensitive PMOS transistor fabricated in a 65 nm process, where the temperature-insensitive PMOS transistor has a second oxide or a second oxide thickness, where the second oxide has a mid oxide thickness according to an embodiment of the present invention. Transistor 200 is a temperature-insensitive PMOS transistor having connection nodes 201, 202, 203, and 204, which correspond to source, gate, drain, and body connections, respectively. Transistor 200 can be fabricated in a 65 nm process, and has a second oxide 207, where the second oxide has a mid oxide thickness 206. For example, in some embodiments, the mid oxide thickness 206 may be in the range of 25.4-28.2 Å (Angstrom). Transistor 200 is biased by element 205, where element 205 may supply voltage in a range of 0.9-1.0 volts and can be coupled to either the source or the drain of transistor 200. In one embodiment, element 205 is coupled to the source 201 of PMOS transistor 200, and a second bias element 208 may be applied to the gate 202 of the transistor 200. Element 208 may provide a bias voltage equivalent to Vcc+Vt according to embodiment of the present invention, where Vcc corresponds to a core voltage, and Vt correspond to a threshold voltage of transistor 200. Elements 205 and 208 can have voltages other than what have been indicated, and can yield the same temperature-insensitive behavior according to an embodiment of this invention. Speed performance of transistor 200 is shown in curve 250 of graph 220 in FIG. 2C, as will be described in detail below. In some embodiments, transistor 200 can be fabricated in any process node 65 nm or smaller, provided that processes smaller than 65 nm have capabilities to produce transistors with geometry equivalent to geometry of transistor 200.

In another embodiment, a different transistor having equivalent temperature-insensitivity behavior can be fabricated in a 65 nm process according to the embodiment of this invention. For example, a temperature-insensitive NMOS transistor may be fabricated in a 65 nm process having a second oxide 207 where the second oxide has a mid oxide thickness 206, and voltage biases 205 and 208. In some embodiments, other oxide thicknesses and/or bias voltages may be used.

Figure 2C:
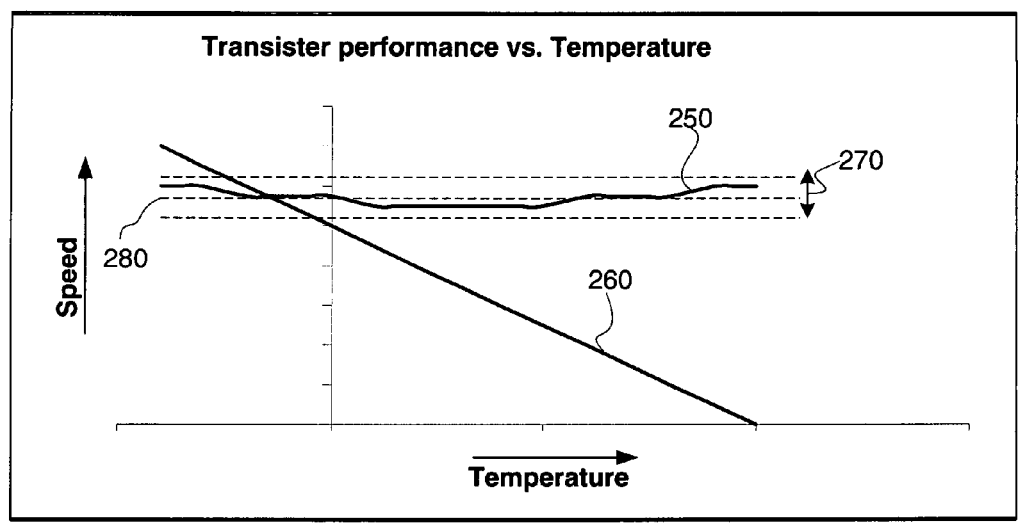
FIG. 2C illustrates a graph showing a speed performance of various transistors over a temperature range.

FIG. 2C illustrates a graph showing a speed performance of various transistors over temperature range. Curve 260 represents speed performance of a typical transistor, such as transistor 210 of FIG. 2A, over a temperature range, where the temperature range may be at least 15 degrees Celsius. In general, speed of transistor 210 decreases as temperature increases.

Curve 250 represents speed performance of a temperature-insensitive transistor, such as transistor 200 of FIG. 2B, over the same temperature range. The temperature-insensitive transistor performance illustrated in curve 250 is insensitive to temperature variation, therefore having a desirable behavior. Speed indication 280 represents average speed over temperature range, and speed indication 270 represents speed variance over the same temperature range of a temperature-insensitive transistor. The speed variance 270 can be +/−15% the average speed 280, according to an embodiment of this invention. Transistor 200 generally has equivalent behavior to curve 250 and transistor 210 generally has equivalent behavior to curve 260. Transistors 200 and 210 can be fabricated on a single die of a silicon wafer in a 65 nm process having at least two oxide thicknesses according to an embodiment of this invention. Smaller than 65 nm processes may be used to produce transistor 200. Note that the curves shown in FIG. 2C are merely representative, and actual transistors may have different curves. In general, a typical transistor has performance that varies with temperature, and a temperature-insensitive transistor maintains a relatively constant performance (e.g. within +/−15% of an average speed performance) over a temperature range, for example the temperature range can extend from −50 degrees Celsius to 150 degrees Celsius.

Figure 3A:
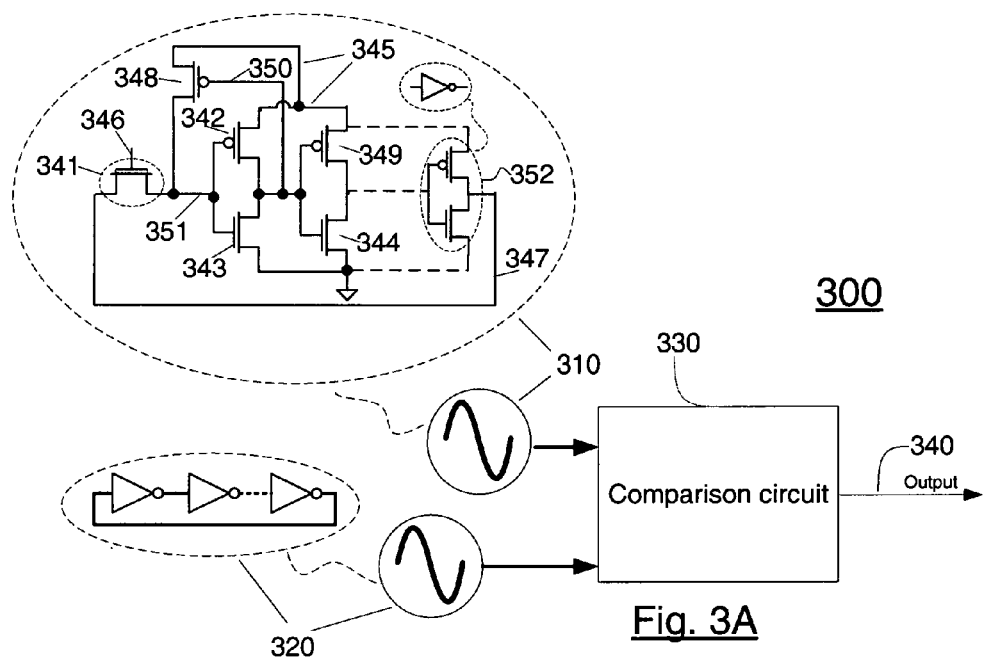
FIG. 3A is a block diagram of a frequency comparison circuit that provides an output indicative of a frequency difference according to an embodiment of the invention.

FIG. 3A is a block diagram illustration of a frequency comparison circuit according to an embodiment of the present invention. Circuit 300 provides an output 340 indicative of a comparison of the two oscillating signals provided by circuits 310 and 320, where the oscillating signals can be any frequency. Output 340 can be monitored and the data can be processed and/or stored for analysis and data comparison over the life of an IC. The data comparison operation can, for instance indicate a factor shift, for example, a voltage drop or a frequency drift, where a corrective action can be triggered to adjust at least one element of an IC.

Circuit 310 is a temperature-insensitive oscillator, such as a ring oscillator, having at least one temperature-insensitive transistor 200. According to an embodiment of the present invention, circuit 310 can be constructed incorporating a transistor 341, where transistor 341 is a NMOS transistor fabricated in a 65 nm technology having an mid oxide and having a gate 346 biased by a voltage of about Vcc+Vt. Source node of transistor 341 is coupled to gate nodes of transistor 343 and transistor 342 (node 351). Transistor 343 has a thin oxide and a low Vt, transistor 342 has a thin oxide and regular Vt. Outputs from transistors 342 and 343 (node 350), is coupled to the gate of transistor 348 which is a weak PMOS transistor processed having a thin oxide and regular Vt. Node 350 is also coupled to the gates of transistors 344 and 349. The drain of transistor 348 is coupled to node 351 and the source of transistor 348 is coupled to a supply node 345. Transistors 344 and 349 are processed to have thin oxide and regular Vt, and are coupled to form an inverter. The feedback path 347 of the temperature-insensitive ring oscillator coupling the output of the inverter 352 to the drain node of transistor 341, as shown in circuit 310 of FIG. 3A. Node 345 is a supply node and can be biased by a voltage regulator having a voltage in a range of 0.9-1.1 volts. Transistor 341 of circuit 310 is a temperature-insensitive, and has performance equivalent to curve 250 of FIG. 2C. In other examples, additional inverters may be coupled between transistors 349 and 344, and inverter 352. The added inverters may add delay, therefore slowing down operation of the ring oscillator 310, meaning lower output frequency at node 347.

Circuit 320 is a temperature-sensitive oscillator, and has a performance that varies depending on temperature. A simple ring oscillator can be used as circuit 320 in some embodiments.

Circuit 330 is a frequency comparator that compares outputs from circuits 310 and 320 according to an embodiment of the present invention. In some embodiment, circuit 330 can use counters. For example, circuit 310 can trigger counter circuits and thus generate gated signals used to sample another signal source such as output of circuit 320. Other methods to compare frequencies from two sources are well known to persons skilled in the art. Frequency comparator 330 provides an output 340.

Figure 3B:
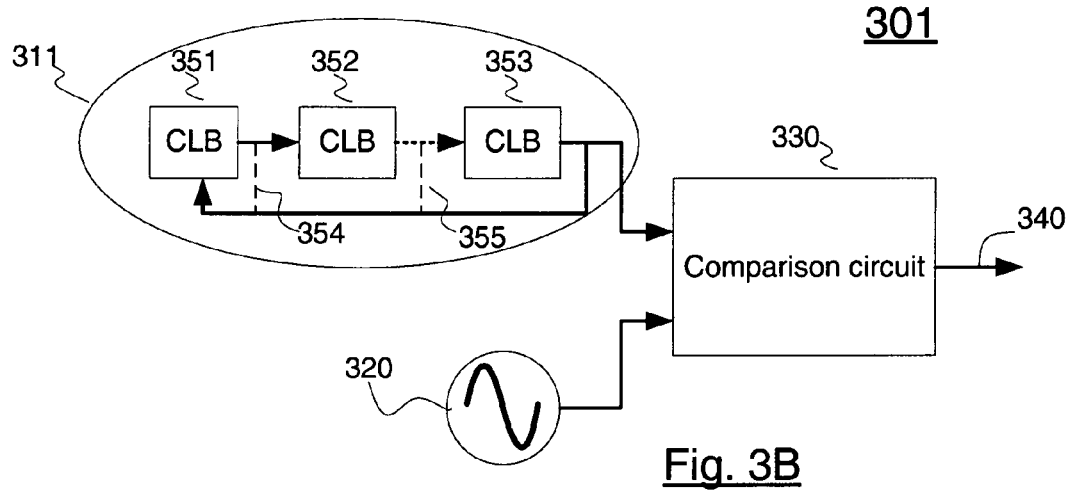
FIG. 3B is a block diagram of a frequency comparison circuit that illustrates the use of a configurable logic block (CLB) according to an embodiment of the invention.

FIG. 3B is a block diagram of a frequency comparison circuit illustrating the use of a configurable logic block (CLB) according to an embodiment of the invention. Circuit 311 is a temperature-insensitive ring oscillator using CLBs 351-353 and can be coupled to construct the temperature-insensitive ring oscillator. A typical CLB has many configurable resources such as, logic gates and lookup tables. The temperature-insensitive ring oscillator design can use all or part of the resources of the CLB. For instance, one or more CLBs 351-353 may be configured as delay elements or inverting gates to form a ring oscillator.

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

In general, an IC has many frequency rates, and a person skilled in the art can determine the proper operating frequency of a design. Therefore, it is desirable to have a circuit that can be configured to yield the proper frequency. A ring oscillator frequency depends on the length of inverting gates that are coupled in series. For example having more inverting gates or delay elements in the ring oscillator can yield a lower output frequency. Constructing circuit 311 constructed utilizing CLBs can be desirable due to interconnectivity options available within a CLB or several coupled CLBs. Circuit 311 can be constructed in one CLB or multiple CLBs. Connections 354-355 are used in some embodiments of the present invention to adjust the oscillator frequency. A person skilled in the art can determine, for example, which coupling node 345 or 355 is appropriate for their design.

Figure 4:
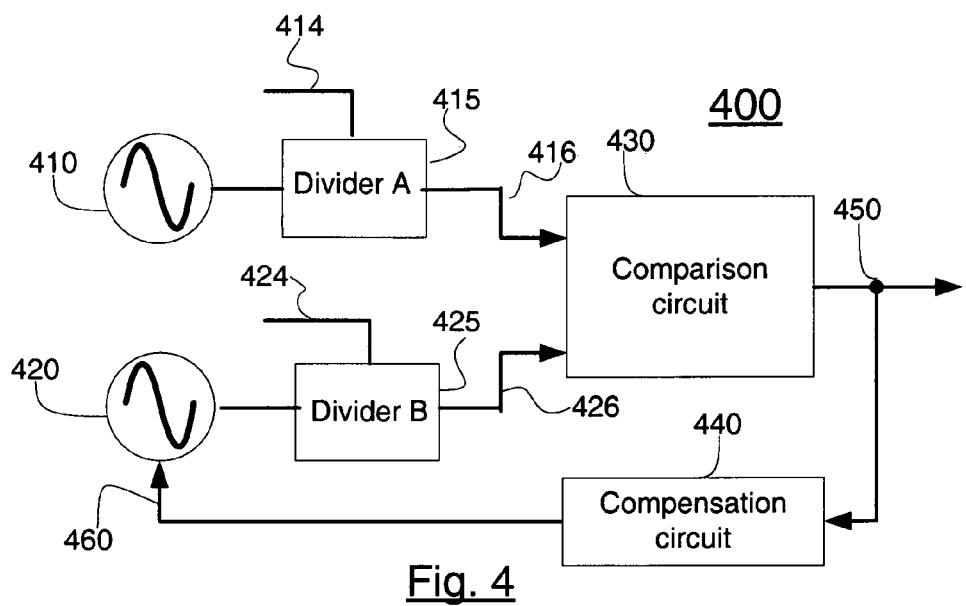
FIG. 4 is a block diagram of a frequency comparison circuit having a compensation circuit coupled between a frequency comparator and a temperature-sensitive oscillator circuit, and having a divider circuits coupled to output of the oscillators according to an embodiment of the invention.

FIG. 4 is a block diagram of a frequency comparison circuit 400 having a compensation circuit coupled between the output of a temperature-insensitive oscillator circuit and of a temperature-sensitive oscillator circuit, according to an embodiment of the invention. In some embodiment, a frequency comparison circuit may include divider circuit coupled to outputs of the oscillators.

Circuit 440 is a compensation circuit which outputs control signal(s) 460 in response to range of signal(s) 450. In one embodiment of the present invention, circuit 430 can output a signal that can have a varying pulse width in response to frequency difference between circuit 410 and 420. Signal(s) 460 is coupled to circuit 420. Circuit 420 can adjust its operation in response to signal(s) 460. Circuit 100 can be used as circuit 420 according to an embodiment of the present invention.

Circuit 415 is a divider circuit having control signal(s) 414 according to an embodiment of this invention. Circuit 415, coupled between circuit 410 and circuit 430, and may include a divide ratio that can be configured using control signal(s) 414. In some embodiment, the divide circuit 415 is used to produce an output signal 416 that is equivalent to signal 426. Other embodiments can include divider circuit 425 coupled between oscillator 420 and comparison circuit 430 for added design flexibility.

Figure 5:
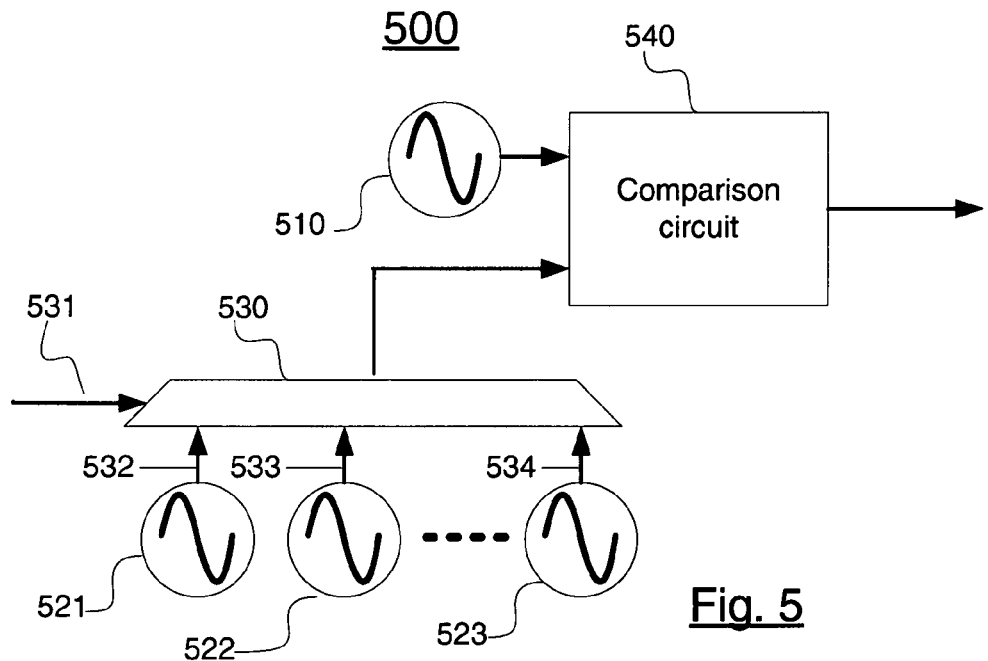
FIG. 5 is a block diagram of a frequency comparison circuit having a plurality of temperature-sensitive oscillator circuits coupled to inputs of a select circuit that is coupled to an input of a frequency comparator according to an embodiment of the invention.

FIG. 5 is a block diagram of a frequency comparison circuit 500 having a plurality of temperature-sensitive oscillator circuits coupled to inputs of a select circuit that is coupled to an input of a frequency comparator according to an embodiment of the invention. Circuit 530 is a select circuit, selecting an output from plurality of temperature-sensitive oscillators 521-523 may be coupled to an input of circuit 540 according to an embodiment of the present invention.

Multiple temperature-sensitive oscillator instantiations 521-523 are shown in FIG. 5. For instance a design may require more than one temperature-sensitive oscillator. The IC can, for example, record multiple readings from the temperature-sensitive oscillators 521-523 and calculate an average temperature. In another example, the IC can determine what part of the IC may be experiencing temperature variation. Yet in another example, the IC can use the multiple temperature-sensitive oscillators as a part of a redundancy temperature monitoring system.

The select circuit 530 has select control signal(s) 531 enabling the select circuit to select many inputs 532-534. The select control signal(s) 531 can be manually configured or coupled to an automatic timing circuit according to an embodiment of the present invention. An example of an automatic timing circuit is a counter circuit coupled to a clock configured as a timer circuit. Other examples of a timer circuits are available and well know to persons skilled in the art.

Figure 6:
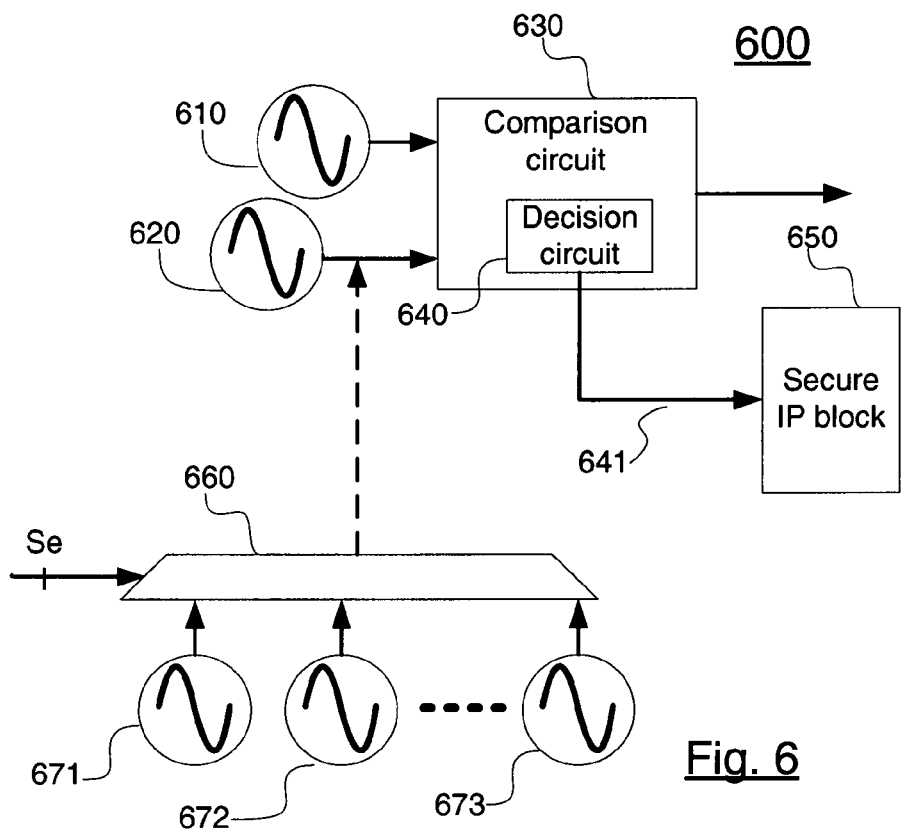
FIG. 6 is a block diagram of a frequency comparison circuit having a decision circuit coupled to an input of a secure IP block according to an embodiment of the invention.

FIG. 6 is a block diagram of a frequency comparison circuit 600 having a decision circuit coupled to an input of secure IP block according to an embodiment of the invention.

Circuit 640 is a decision circuit that can assert output 641 in response to rapid temperature change. For example, a rapid temperature change can be a 10 degree change in temperature in a 100 ns time duration. According to one embodiment of the present invention, circuit 640 can evaluate inputs from a temperature-insensitive oscillator circuit 610 and temperature-sensitive oscillator circuit 620 and assert the output 641 in response to a large frequency disparity in a sampled time duration, where the sampled time duration can be programmable.

Circuit 640 can assert output signal 641, which is coupled to a Secure IP block circuit 650 and trigger a security protocol. In one embodiment of the present invention the output signal 641 can disable circuit 650 when asserted. In another embodiment output signal 641 can be used to power down at least one portion of an IC in response to an abrupt temperature change. Other possible security protocols can include erasing all or partial configuration of the PLD, or resting the IC, or destroying the IC.

Circuit 600 can include a select circuit 660 and plurality of temperature-sensitive oscillators 671-673 according to an embodiment of the present invention. Circuit 600 with select circuit 660 can be used to verify abrupt temperature change from multiple locations, and assert output 641 as a response to security breach.

Figure 7:
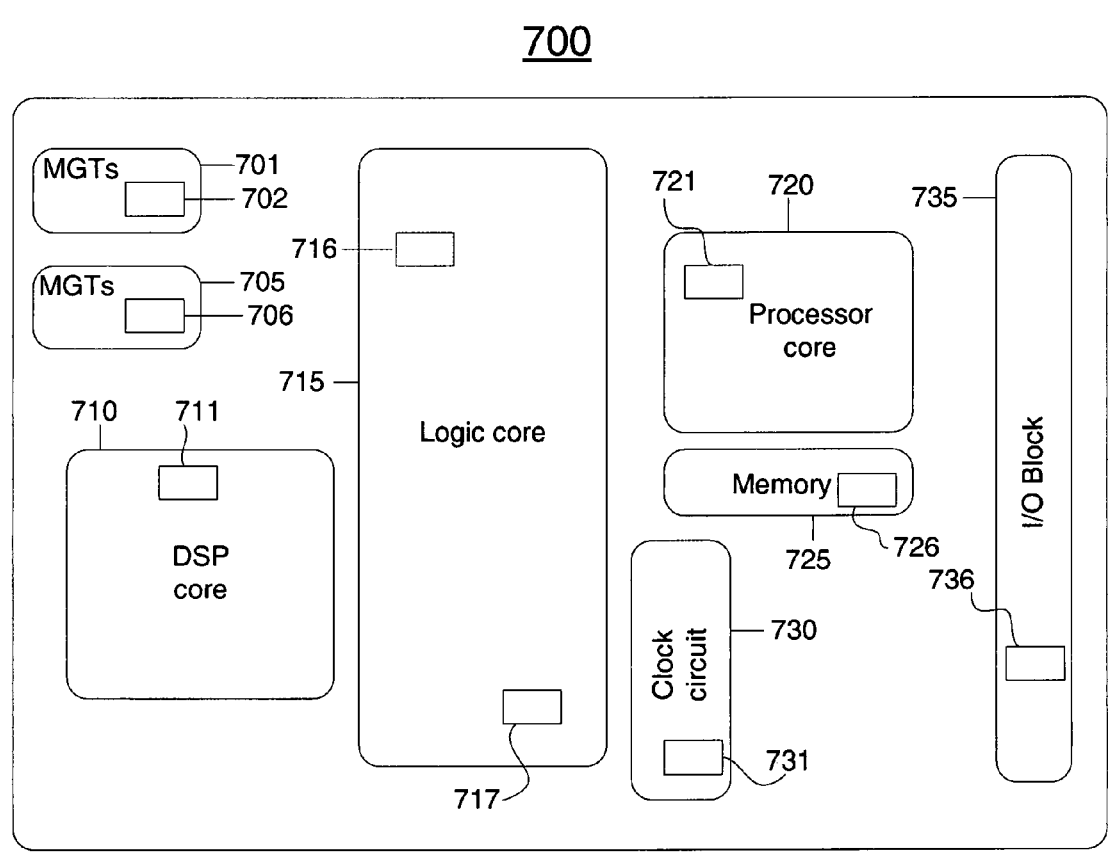
FIG. 7 is a block diagram of an integrated circuit having design blocks including frequency comparison circuits according to an embodiment of the invention.

FIG. 7 is a block diagram of an integrated circuit having a plurality of blocks including frequency comparison circuits according to an embodiment of the invention.

Circuit 700 can include plurality of blocks such as a Digital Signal processor core (DSP) 710, Multi Gigabit Transceiver core (MGT) 701, 705 and other blocks. The mixed signal design blocks can have a single or multiple frequency comparison circuits integrated in each block according to an embodiment of the present invention. Output(s) from the frequency comparison circuit(s) can be observed, and processed in accordance to a design parameters, where the design parameters can include reducing operating frequency or/and turning power off to select blocks or the entire IC. For example, circuit 710 may have a frequency comparison circuit 711. When circuit 711 asserts its output in response to temperature variation, circuit 700 can reduce the operating frequency of circuit 710 as one possible action. As another example, circuit 705 may have a frequency comparison circuit 706. When circuit 706 asserts its output in response to temperature variation, circuit 700 can power down circuit 705 as one possible action. In another embodiment of the present invention, a single frequency comparison circuit can be placed in an IC. The frequency comparison circuit can be any one of circuits 300, 301, 400, 500, 600, or another configuration employing a temperature-insensitive transistor.

Figure 8:
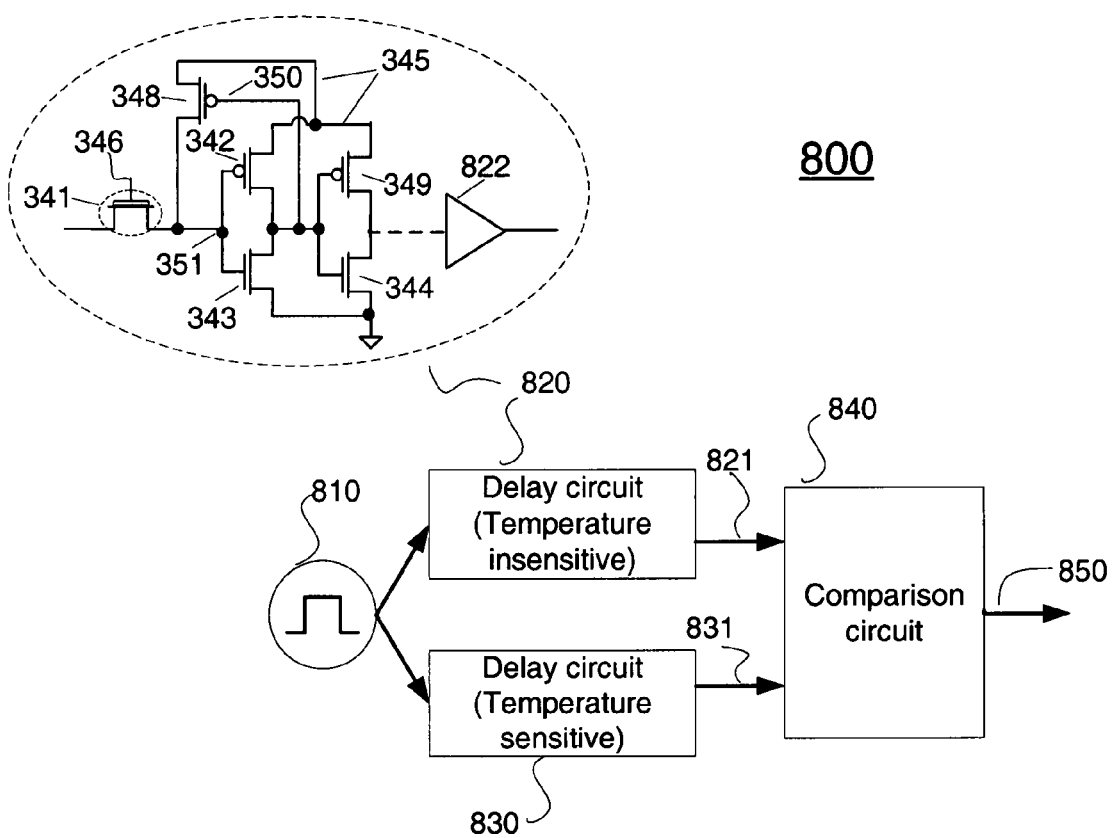
FIG. 8 is a block diagram of a delay comparison circuit having an output indicative of a phase difference between input signals according to an embodiment of the invention.

FIG. 8 is a block diagram of a delay comparison circuit 800 having an output indicative of a phase difference between input signals according to an embodiment of the invention. Circuit 840 is a phase comparator having an output 850 indicative of a phase difference between inputs 821 and 831.

Circuit 810 is a pulse generator according to an embodiment of the present invention. Circuit 810 can provide an output coupled to inputs of circuit 820 and circuit 830, where circuit 820 is a temperature-insensitive delay circuit and circuit 830 is a temperature-sensitive delay circuit. Circuit 820 is similar to circuit 310 of FIG. 3A as previously described except for elements 352 and feedback path 347. Circuit 820 has a buffer 822 coupled to the output of transistors 344 and 349. Transistor 341 of circuit 820 of FIG. 8 is a temperature-insensitive, where the delay performance is temperature-insensitive. In some embodiment, transistors used in constructing the buffer 822 can have the same specifications as transistors 344 and 349. Temperature-sensitive delay circuit 830 can include one or more buffers, where a buffer can include an even number of inverting.

For example, a given temperature condition, circuit 800 can indicate negligible phase difference at node 850. When temperature fluctuates, node 850 can provide a signal indicative of a measurable phase difference, where the phase difference can be attributed to a corresponding temperature variance. Circuit 810 can be an internal or external clock source or a pulse generator according to an embodiment of the current invention.

Figure 9:
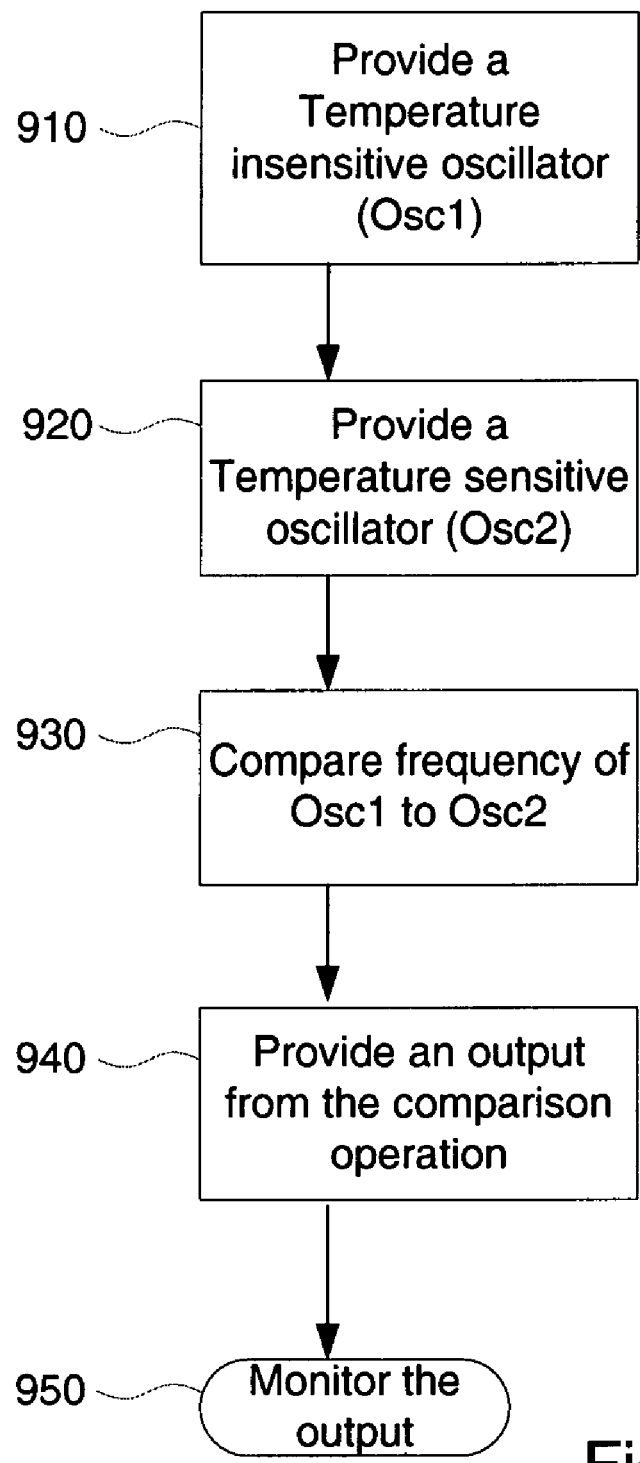
FIG. 9 is a flow chart illustrating a method of detecting temperature variance by comparing two oscillator outputs according to an embodiment of the invention.

FIG. 9 is a flow chart illustrating a method of detecting temperature variance by comparing two oscillator outputs according to an embodiment of the present invention. The method includes providing a temperature-insensitive oscillator (Osc1) 910, a temperature-sensitive oscillator (Osc2) at step 920. Output of Osc1 and Osc2 are compared at step 930. An output from the comparison operation is provided at step 940. The output of the comparison operation is monitored and/or processed at step 950.

In some embodiments, an IC can be partially or fully powered down in response to temperature conditions approaching IC performance degradation. In some embodiments, a signal indicative of rapid temperature variance can be outputted. In some embodiments, the method may include reporting, storing, and comparing data from various process corners, and comparing current results against stored historic process data. This enables generating a signal indicative of process shift. Monitoring and processing shift results in this way can enable modifying process or a process shift parameters to yield a reliable, producible IC.

Figure 10:
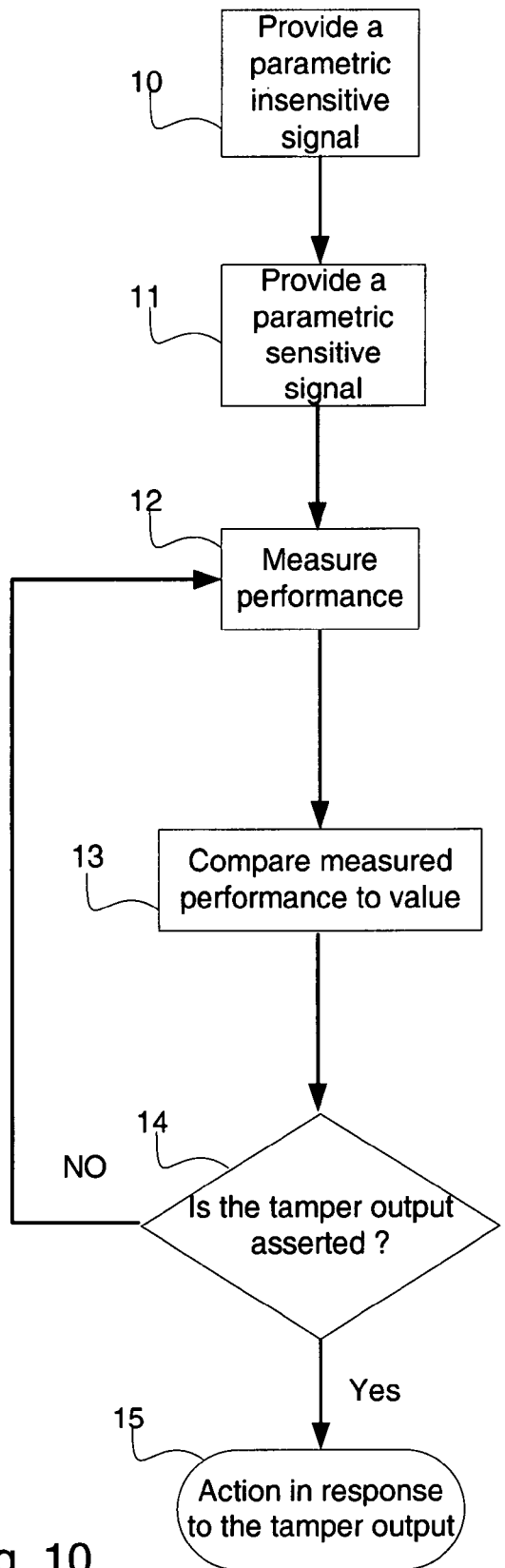
FIG. 10 illustrates a flow chart diagram according to an embodiment of the present invention.

FIG. 10 illustrates a flow chart diagram according to an embodiment of the present invention. The method illustrated in FIG. 10 can be used to detect IC tampering due to a parametric shift. The parametric shift may include temperature variations and/or voltage variations and/or process variations. The method includes providing a parametric-insensitive clock (Step 10), a parametric-sensitive clock (Step 11), and measuring frequency performance of the parametric-insensitive clock and the parametric-sensitive clock (Step 12). The parametric-sensitive clock may be sensitive to temperature variations and/or voltage variations and/or process variations. An example of the measuring can be counting one clock source in reference to the other clock source and generating an output indicative of the counting. One form for representing the output indicative of the counting can be a pulse that has a varying pulse width. A comparison circuit receives the measured frequency and a value representing a threshold, and generates a tamper signal (Step 13). The tamper signal generated by the comparison circuit, when asserted, indicates tampering. At step 14 a decision is made based on the tamper signal. If the tamper signal is asserted, then action will be taken in step 15. If the tamper is signal is not asserted, the method returns to step 12 to continue measuring and comparing frequency performance. The method steps recited above for detecting parametric shift may be used to configure a PLD having a core oscillator source and a circuit design.

Figure 11:
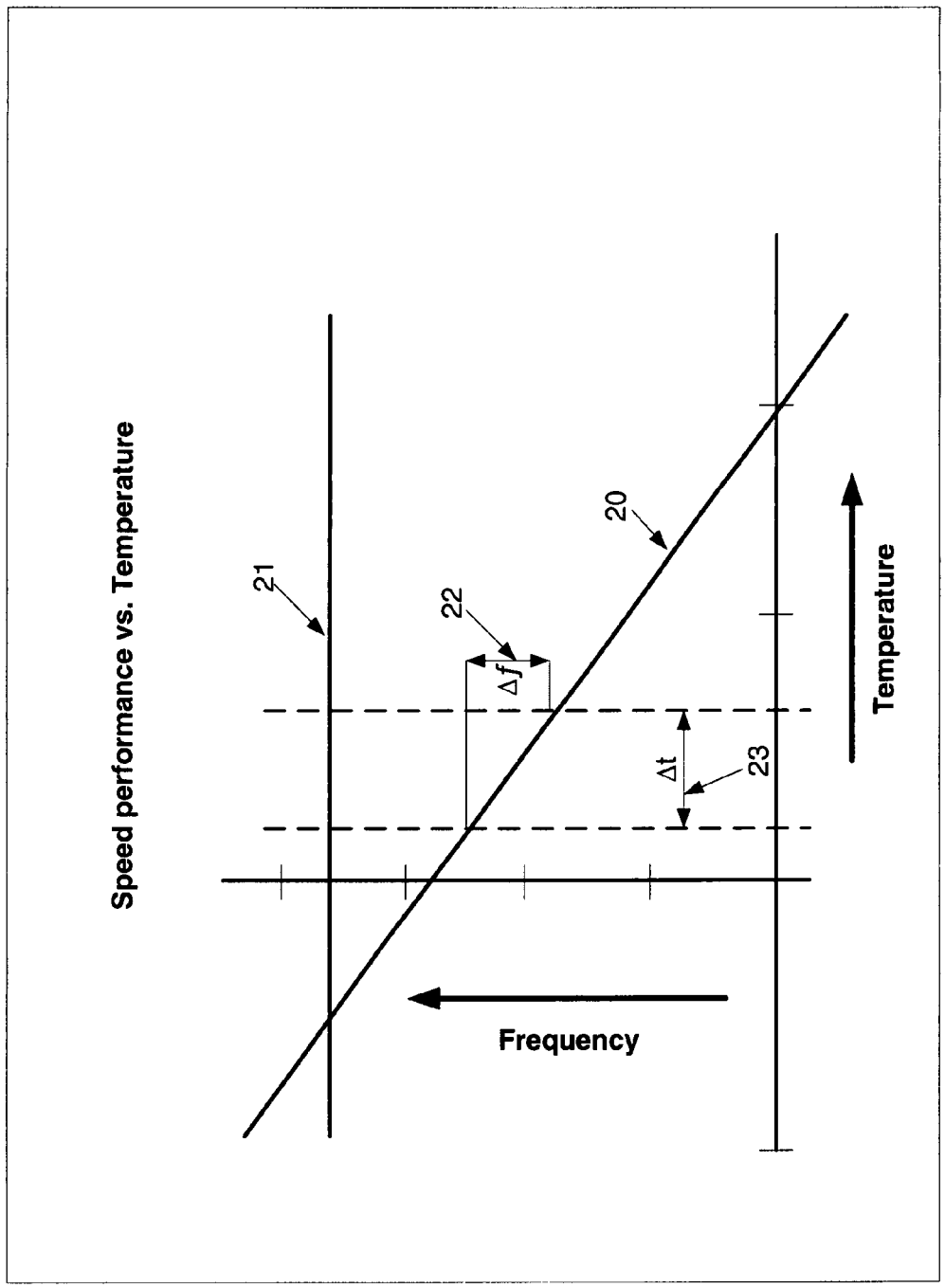
FIG. 11 illustrates a graph showing performance of a temperature-insensitive oscillator and a typical temperature-sensitive oscillator.

FIG. 11 illustrates a graph showing performance of a temperature-insensitive oscillator and a typical temperature-sensitive oscillator. Curve 20 represents a typical temperature-sensitive oscillator frequency performance over a temperature range. In general oscillator frequency decreases as temperature increases. Curve 21 illustrates temperature-insensitive oscillator frequency performance over the same temperature range. The temperature-insensitive oscillator has insignificant frequency performance change over the temperature range. The temperature-insensitive oscillator output can be used as a reference to capture variation in other clock sources that have frequency performance similar to curve 20. An example of frequency to temperature correlation is illustrated in FIG. 11. For any given frequency there is a corresponding temperature. Changes in temperature 23 will correspond to changes in frequency 22 of the temperature-sensitive oscillator. This relationship can be captured and used to calibrate an IC or detect temperature variation of an IC. Note, FIG. 11 is a simplistic representation of the temperature-sensitive and the temperature-insensitive oscillators, and the drawing is for illustration purposes only.

Figure 12:
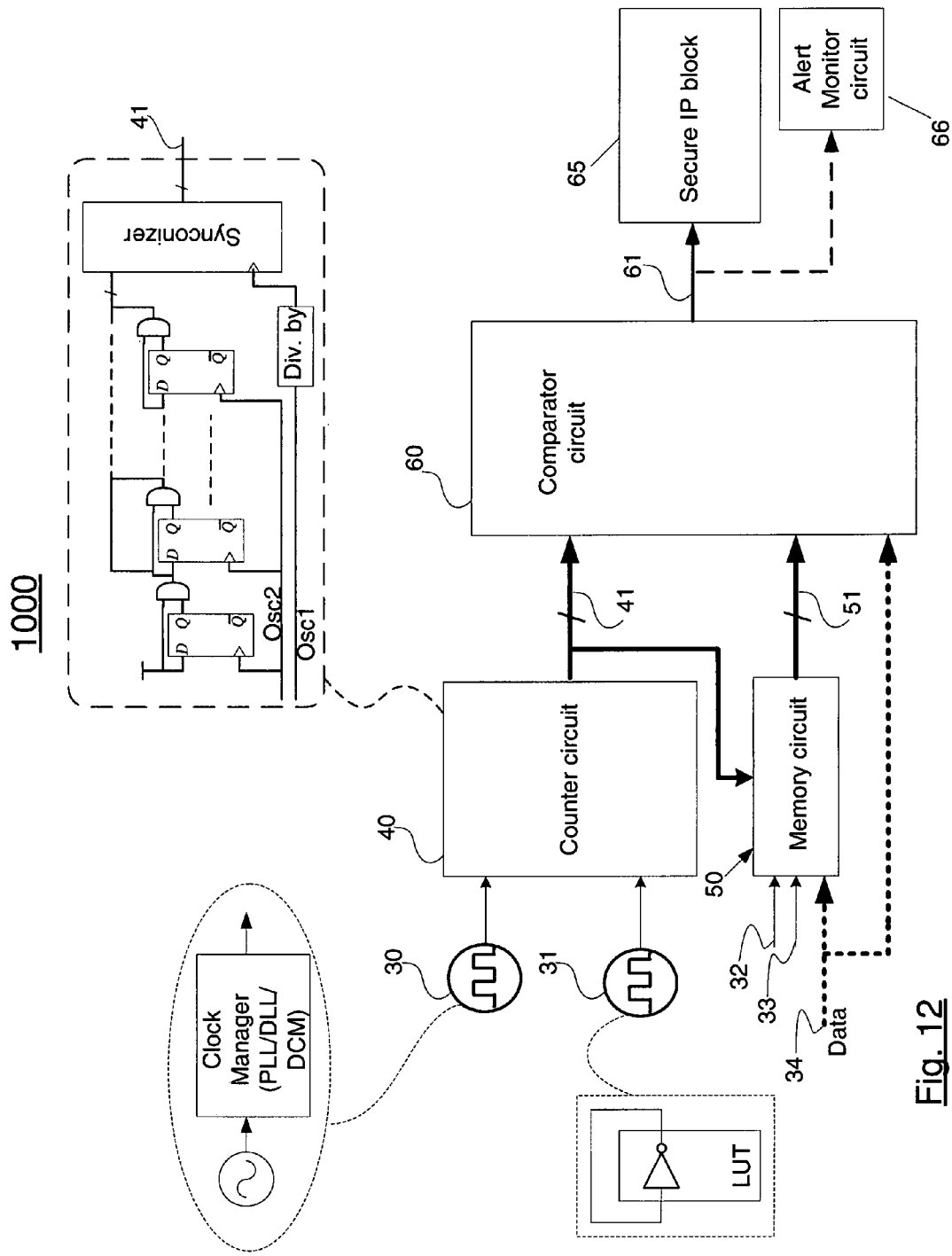
FIG. 12 is a block diagram of a frequency comparison circuit according to an embodiment of the invention.

FIG. 12 is a block diagram of a frequency comparison circuit according to an embodiment of the present invention. In some embodiments, the circuit shown in FIG. 12 can be used to perform some or all the method steps of FIG. 10. The circuit in FIG. 12 is a frequency comparison circuit that can be used to detect tampering, having a temperature-sensitive oscillator 31, a temperature-insensitive oscillator 30, a counter circuit 40, a storage element 50, a comparator circuit 60, and a secure IP block 65. The temperature-sensitive oscillator 31 can be configured using one or more look up tables (LUTs) of a programmable logic device (PLD). For example, in one embodiment a single LUT is configured as an inverter, and the output of the inverter is connected to its input forming a ring oscillator. This implementation will yield a very high frequency and high area and power efficiency. The high frequency can increase resolution of frequency measurement. In some embodiments, the temperature-sensitive oscillator 31 is the core oscillator and has a frequency response over a temperature range similar to curve 20. Other implementations of oscillator 31 that have comparable performance can be implemented internal or external to an IC and it is well known to persons skilled in the art. The temperature-insensitive oscillator 30 has frequency performance similar to curve 21 of FIG. 11. The temperature-insensitive oscillator 30 can be internal or an external temperature-insensitive clock source. Other examples of the temperature-insensitive oscillator 30 can include a temperature-insensitive reference signal or clock connected to a clock manager circuit providing a range of frequencies that is applicable to the design specification. The clock manager circuit may be internal or external to the IC, an example of an internal clock manager circuit can be a phase lock loop (PLL) or a digital clock manager (DCM) of the PLD including, delay lock loop (DLL). The PLD can also include a clock data recovery (CDR) of a multi gigabit transceiver (MGT) having the PLL that can be used as the clock manager. The temperature-insensitive oscillator 30 also can be a temperature-insensitive ring oscillator having at least one temperature-insensitive transistor such as ring oscillator 310 of FIG. 3A. Clock 30 and clock 31 are connected to inputs of a counter circuit 40. Counter circuit 40 counts cycles of the temperature-sensitive oscillator 31 referenced to the temperature-insensitive oscillator 30. For instance counter circuit 40 may count cycles of oscillator 31 during one cycle of oscillator 30. A divider circuit can be used to divide the temperature-insensitive oscillator 30, the divider can be programmable. Dividing clock 30 can yield a better accuracy and repeatability, due to increasing the time period for counting clock 31. Note that in some embodiments, cycles of oscillator 30 may be counted during one period of oscillator 31. Other implementations of the counter circuit 40 and/or the method of referencing one clock signal to another are well known to persons skilled in the art. The counter circuit output 41 is connected to an input of the comparator circuit 60 and the other input of the comparator is connected to a value 51. The value 51 can be sourced internally or externally. The value 51 is a threshold or tamer limit used to compare the counter circuit output 41. The value 51 can be written into a memory element 50 using typical memory control signals such that write enable 32, and load or a clock signal 33. The value 51 can be written manually via signal 34 or using the counter circuit output 41 during the setup phase of circuit 1000. The value can also be loaded from an external source to the input of the comparator circuit via signal 34. The comparator circuit 60 outputs a tamper signal 61 connected to a secure IP block 65. The tamper signal 61 is asserted if counter circuit output 41 exceeds the value 51. The IP block 65 may contain proprietary designs, such that when tamper signal 61 is asserted the IP block will react to protect its contents. As an example, the IP block can halt operation and/or erase stored information, or self destruct. Tamper signal 61 can also be connected to an alert monitor circuit 66 that can be used as a part of a system-wide tampering and/or temperature change alert monitoring. Other refinements to ensure comprehensive tampering detection may include multiple instantiations of circuit 1000 and/or using multiple instantiations of circuit 1000 coupled to other temperature-insensitive and temperature-sensitive oscillators having an oscillator phase different from oscillator phase of source 30 and 31.

The above example describes an IC for detecting a frequency variation of an oscillator due to temperature change. Other parametric shifts, such as supply voltage variations can be detected using the circuit described above. An example for IC for detecting a frequency variation of an oscillator due to supply voltage change can include a voltage-sensitive oscillator having an output frequency that varies as supply voltage changes, and a voltage-insensitive oscillator having an output frequency that is insensitive to supply voltage change. In general, a voltage-sensitive oscillator output frequency decreases as supply voltage decreases.

Further, capacitors, pull-ups, pull downs, transistors; level shifters, P-channel transistors, N-channel transistors, biasing circuits, oscillators, clock dividers, and other components other than those described herein can be used to implement the invention. Oscillators may be replaced with other means of producing time measurements. Transistor and non-transistor devices may be built with parametric sensitivity and with parametric-insensitivity that permit implementation of the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents. Note that claims listing steps do not imply any order of the steps.

What is claimed is:

1. A method for detecting temperature in an integrated circuit (IC), comprising:
   providing a temperature-insensitive oscillator having at least one temperature-insensitive transistor and a first oscillating output, wherein performance of the temperature-insensitive oscillator is insensitive to temperature;
   providing a temperature-sensitive oscillator having a second oscillating output, wherein performance of the temperature-sensitive oscillator varies with temperature;
   comparing the first oscillating output and the second oscillating output;
   providing a compare output in response to the comparing; and
   selectively powering-down at least a portion of the IC in response to the compare output indicating a change in temperature.

2. The method recited in claim 1, further comprising evaluating the compare output with a stored data and generating a shift result, wherein the shift result indicates whether a process shift has occurred.

3. The method recited in claim 2, further comprising modifying the process shift, wherein the process shift is a parameter of the IC.

4. The method recited in claim 1, wherein the comparing comprises counting cycles of the temperature-insensitive oscillator and the temperature-insensitive oscillator.

5. An integrated circuit fabricated in a process having at least a first oxide thickness and a second oxide thickness, comprising:
   a temperature-insensitive circuit having at least one temperature-insensitive transistor, wherein delay of the temperature-insensitive circuit is insensitive to temperature variations, the temperature-insensitive circuit comprising:
      a first NMOS transistor, having the first oxide thickness;
      a first inverter, having a first input coupled to a source of the first NMOS transistor, and having, a first PMOS transistor including the second oxide thickness, and a second NMOS transistor including a low Vt (Threshold voltage) and the second oxide thickness;
      a second PMOS transistor having, the second oxide thickness, a gate coupled to a first output of the first inverter, and a drain coupled to the first input of the first inverter;
      a second inverter having a second input coupled to the first output of the first inverter and having the second oxide thickness and a second output;
   a temperature-sensitive circuit, having a third output and at least one temperature-sensitive transistor, wherein the at least one temperature-sensitive transistor has the second oxide thickness;
   a comparison circuit having a comparison output, a third input coupled to the second output of the second inverter of the temperature-insensitive circuit, and a fourth input coupled to the third output of the temperature-sensitive circuit, wherein the comparison output of the comparison circuit indicates a difference between the third and fourth inputs of the comparison circuit, and wherein the first oxide thickness is a mid oxide thickness, and the second oxide thickness is a thin oxide thickness, wherein the temperature-sensitive circuit comprises a plurality of temperature-sensitive circuits having a respective plurality of outputs, the integrated circuit further comprising:
   a select circuit, comprising:
      a plurality of select inputs coupled to the respective plurality of outputs of the plurality of temperature-sensitive circuits;
      a select output, coupled to the second input of the comparison circuit; and
      a control input, wherein the control input selectively couples one of the plurality of select inputs as the select output.

6. The integrated circuit recited in claim 5, wherein the at least one temperature-insensitive transistor has a geometry corresponding to a 65 nm process.

7. The integrated circuit recited in claim 5, wherein the at least one temperature-insensitive transistor is biased by a voltage in a range of 0.9-1.1 volts.

8. The integrated circuit recited in claim 5, wherein the temperature-insensitive circuit is a temperature-insensitive ring oscillator, wherein the temperature-insensitive ring oscillator further comprises:
   a third inverter coupled between the second output of the second inverter and a drain of the first NMOS transistor.

9. The integrated circuit recited in claim 8, further comprising:
   a divider circuit coupled to the temperature-insensitive ring oscillator, wherein the divider circuit divides down frequency of the temperature-insensitive ring oscillator.

10. The integrated circuit recited in claim 9, wherein the temperature-sensitive oscillator, further comprises at least one compensation circuit selected from the group consisting of:
    an adjustable voltage regulator coupled to a supply node of the temperature-sensitive oscillator;
    a band-gap circuit coupled to a body node of the at least one temperature-sensitive transistor of the temperature-sensitive oscillator; and
    a plurality of configurable capacitive load circuits coupled to a corresponding plurality of nodes of the temperature-sensitive oscillator.

11. The integrated circuit recited in claim 5, further comprising a compensation circuit coupled between the comparison circuit and the temperature-sensitive oscillator, wherein the compensation circuit is responsive the comparison output.

12. The integrated circuit recited in claim 5, further comprising;
    a decision circuit coupled to output of the temperature-insensitive circuit and the third output of the temperature-sensitive circuit, and generating a decision output responsive to a rapid change between the third and fourth inputs of the comparison circuit;
    a secure IP block coupled to the decision output, wherein the secure IP block follows a security protocol in response to the decision output being asserted.

13. The integrated circuit recited in claim 5, wherein the comparison circuit is at least one of a phase comparator and a frequency comparator.

14. The integrated circuit recited in claim 5, wherein the integrated circuit is a programmable logic device (PLD), and wherein the temperature-insensitive circuit comprises a configurable logic block (CLB) of the PLD.

15. The integrated circuit recited in claim 5, the first NMOS transistor has a gate biased by a first voltage,
    wherein the first voltage is in range of 0.9-1.1 volts.
16. The integrated circuit recited in claim 5, wherein speed performance of the at least one temperature-insensitive transistor over a temperature range is within +/−15% of an average speed performance, wherein the temperature range is at least 15 degrees.

* * * * *